US 011508838B2

(12) United States Patent
Smith et al.

(10) Patent No.: US 11,508,838 B2
(45) Date of Patent: Nov. 22, 2022

(54) SEMICONDUCTOR DEVICE (71) Applicant: KABUSHIKI KAISHA TOSHIBA, Tokyo (JP)

(72) Inventors: Matthew David Smith, Kawasaki (JP); Akira Mukai, Kawasaki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 169 days.

(21) Appl. No.: 17/142,654

(22) Filed: Jan. 6, 2021

(65) Prior Publication Data

US 2022/0123135 A1 Apr. 21, 2022

(30) Foreign Application Priority Data

Oct. 19, 2020 (JP) .............................. JP2020-175298

(51) Int. Cl.
*H01L 29/778* (2006.01)
*H01L 29/205* (2006.01)
*H01L 29/06* (2006.01)

(52) U.S. Cl.
CPC ...... *H01L 29/7786* (2013.01); *H01L 29/0649* (2013.01); *H01L 29/205* (2013.01); *H01L 29/7787* (2013.01)

(58) Field of Classification Search
None
See application file for complete search history.

(56) References Cited

U.S. PATENT DOCUMENTS

| 5,043,777 A * | 8/1991 | Sriram ............... H01L 29/802 257/E29.253 |
| 9,559,183 B2 | 1/2017 | Inoue et al. |
| 9,947,781 B2 * | 4/2018 | Minoura ............ H01L 29/7787 |

(Continued)

FOREIGN PATENT DOCUMENTS

JP 2021-12913 A 2/2021

OTHER PUBLICATIONS

Zhou, et al., "7.6 V Threshold Voltage High-Performance Normally-Off Al$_2$O$_3$/GaN MOSFET Achieved by Interface Charge Engineering", IEEE Electron Device Letters, vol. 37, No. 2, Feb. 2016, 4 pages.

Kato, et al., "Suppression of short-channel effects in normally-off GaN MOSFETs with deep recessed-gate structures", Japanese Journal of Applied Physics 59, SGGD13 (2020), 6 pages.

(Continued)

*Primary Examiner* — Grant S Withers
(74) *Attorney, Agent, or Firm* — Oblon, McClelland, Maier & Neustadt, LLP (57) ABSTRACT

According to one embodiment, a semiconductor device includes first, second, and third electrodes, a semiconductor member, and a first insulating member. The semiconductor member includes a first face and a first side face. A third insulating region is between the first face and the third electrode in a second direction. A first insulating region is between the first side face and the third electrode in a first direction. The first side face includes first and second side face portions. The first side face portion is between the first face and the second side face portion in the second direction. At least a first angle between a first plane including the first face and the first side face portion and a second angle between the first plane and the second side face portion is less than 90 degrees. The second angle is different from the first angle.

20 Claims, 9 Drawing Sheets

(56) References Cited

U.S. PATENT DOCUMENTS

| | | |
|---|---|---|
| 10,083,835 B2 | 9/2018 | Laven et al. |
| 2007/0176204 A1 | 8/2007 | Murata et al. |
| 2011/0019873 A1 | 1/2011 | Yamato |
| 2011/0062438 A1* | 3/2011 | Kaneko ............ H01L 29/42316 257/43 |
| 2011/0133205 A1* | 6/2011 | Nagahisa ............ H01L 29/7787 257/330 |
| 2015/0194512 A1* | 7/2015 | Ohki .................... H01L 29/205 257/194 |
| 2015/0270355 A1* | 9/2015 | Kuraguchi ......... H01L 29/7786 257/194 |
| 2017/0263742 A1* | 9/2017 | Endoh ................ H01L 29/0688 |
| 2017/0317183 A1* | 11/2017 | Kato ................ H01L 21/28264 |
| 2018/0350961 A1 | 12/2018 | Naito |
| 2019/0019873 A1 | 1/2019 | Shiozaki et al. |
| 2020/0006521 A1 | 1/2020 | Banerjee et al. |
| 2020/0119179 A1 | 4/2020 | Mishra et al. |
| 2021/0005730 A1 | 1/2021 | Mukai et al. |

OTHER PUBLICATIONS

Song, et al., "SiO$_2$ ETCH Rate and Profile Control Using Pulse Power in Capacitively Coupled Plasmas", The 20$^{th}$ International Symposium on Plasma Chemistry (ISPC-20) 4 pages.

Tegen, et al., "Etch Characteristics of Al$_2$O$_3$ in ICP and MERIE Plasma Etchers", Journal of the Electrochemical Society, 152(4) 2005, 7 pages.

Pavius, et al., "Profile Angle Control in SIO$_2$ Deep Anisotropic Dry Etching for MEMS Fabrication", 17$^{th}$ IEEE International Conference on Micro Electro Mechanical Systems, Maastricht MEMS 2004 Technical Digest, 2004, 4 pages.

Vladimir, et al., "Deep SiO$_2$ etching with Al and AlN masks for MEMS devices", Journal of Micromechanics and Microengineering, 25 087002, 2015, 9 pages.

Osipov, et al., "Fabrication technology of GaN/AlGaN HEMT slanted sidewall gates using thermally reflowed ZEP resist and CHF3/SF6 plasma etching", CS MANTECH Conference, May 2013, 5 pages.

* cited by examiner

SEMICONDUCTOR DEVICE

CROSS-REFERENCE TO RELATED APPLICATIONS

This application is based upon and claims the benefit of priority from Japanese Patent Application No. 2020-175298, filed on Oct. 19, 2020; the entire contents of which are incorporated herein by reference.

FIELD

Embodiments of the present invention relate to a semiconductor device.

BACKGROUND

There are semiconductor devices such as transistors that use nitride semiconductors. In semiconductor devices, improvement in characteristics is desired.

DETAILED DESCRIPTION

According to one embodiment, a semiconductor device includes a first electrode, a second electrode, a third electrode, a semiconductor member, and a first insulating member. A position of the third electrode in a first direction is between a position of the first electrode in the first direction and a position of the second electrode in the first direction. The first direction is from the first electrode to the second electrode. The semiconductor member includes a first semiconductor region and a second semiconductor region. The first semiconductor region includes $Al_{x1}Ga_{1-x1}N$ ($0 \le x1 < 1$). The first semiconductor region includes a first partial region, a second partial region, a third partial region, a fourth partial region, and a fifth partial region. A direction from the second partial region to the second electrode is along a second direction. The second direction crosses the first direction. A direction from the third partial region to the third electrode is along the second direction. A position of the fourth partial region in the first direction is between the position of the first partial region in the first direction and the position of the third partial region in the first direction. A position of the fifth partial region in the first direction is between the position of the third partial region in the first direction and the position of the second partial region in the first direction. The second semiconductor region includes $Al_{x2}Ga_{1-x2}N$ ($0 < x2 < 1$, $x1 < x2$). The second semiconductor region includes a first semiconductor portion and a second semiconductor portion. A direction from the fourth partial region to the first semiconductor portion is along the second direction. A direction from the fifth partial region to the second semiconductor portion is along the second direction. The first insulating member includes a first insulating region, a second insulating region, and a third insulating region. The first insulating region is between the fourth partial region and at least a part of the third electrode in the first direction. The second insulating region is between at least a part of the third electrode and the fifth partial region in the first direction. The third insulating region is between the third partial region and the third electrode in the second direction. The semiconductor member includes a first face and a first side face. The third insulating region is between the first face and the third electrode in the second direction. The first insulating region is between the first side face and the third electrode in the first direction. The first side face includes a first side face portion and a second side face portion. A position of the first side face portion in the second direction is between a position of the first face in the second direction and a position of the second side face portion in the second direction. At least a first angle and a second angle is less than 90 degrees. The first angle is an angle between a first plane including the first face and the first side face portion. The second angle is an angle between the first plane and the second side face portion. The second angle is different from the first angle.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
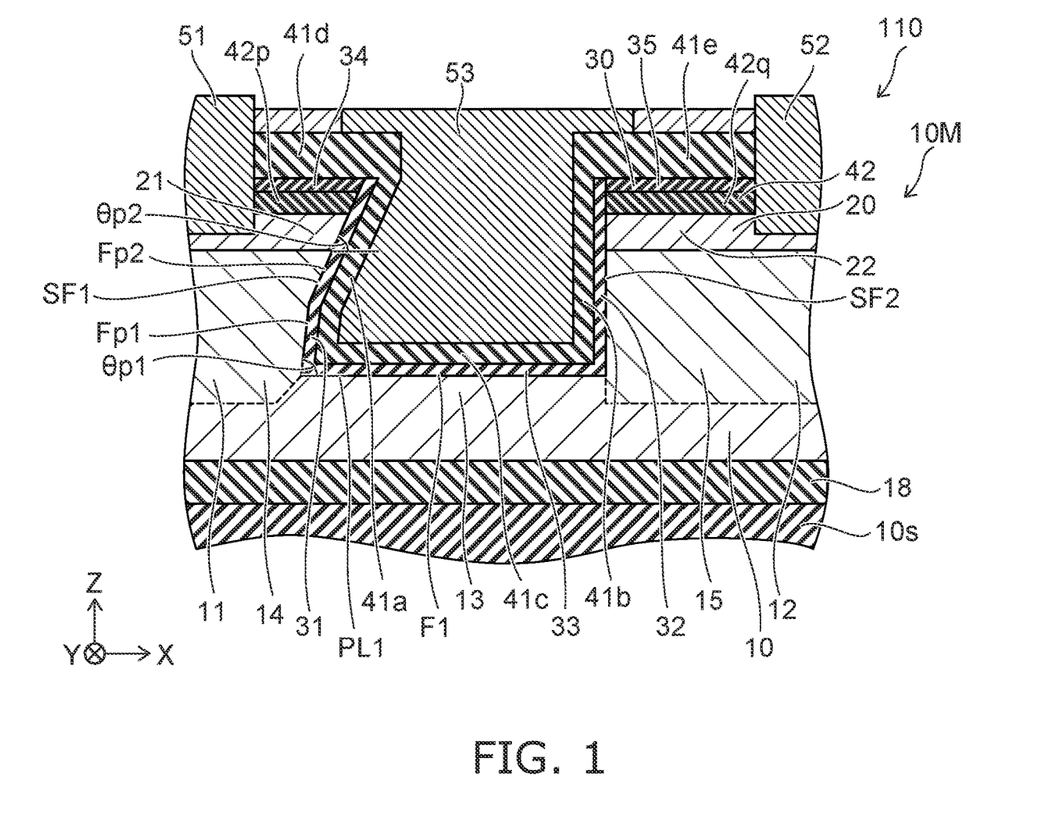
FIG. 1 is a schematic cross-sectional view illustrating a semiconductor device according to a first embodiment.

FIG. 1 is a schematic cross-sectional view illustrating the semiconductor device according to the first embodiment.

As shown in FIG. 1, the semiconductor device 110 according to the embodiment includes a first electrode 51, a second electrode 52, a third electrode 53, a semiconductor member 10M, and a first insulating member 41.

The direction from the first electrode 51 to the second electrode 52 is the first direction. The first direction is, for example, the X-axis direction. One direction perpendicular to the X-axis direction is the Z-axis direction. The direction perpendicular to the X-axis direction and the Z-axis direction is the Y-axis direction.

The position of the third electrode 53 in the first direction (X-axis direction) is between the position of the first electrode 51 in the first direction and the position of the second electrode 52 in the first direction. For example, at least a part of the third electrode 53 is between the first electrode 51 and the second electrode 52 in the first direction.

The semiconductor member 10M includes a first semiconductor region 10 and a second semiconductor region 20.

The first semiconductor region 10 includes $Al_{x1}Ga_{1-x1}N$ ($0 \leq x1 < 1$). The first semiconductor region 10 includes, for example, GaN. The Al composition ratio in the first semiconductor region 10 is, for example, not less than 0 and not more than 0.05.

The first semiconductor region 10 includes a first partial region 11, a second partial region 12, a third partial region 13, a fourth partial region 14 and a fifth partial region 15. The second direction from the first partial region 11 to the first electrode 51 crosses the first direction (X-axis direction). The second direction is, for example, the Z-axis direction.

The direction from the second partial region 12 to the second electrode 52 is along the second direction. The direction from the third partial region 13 to the third electrode 53 is along the second direction.

The position of the fourth partial region 14 in the first direction (X-axis direction) is between the position of the first partial region 11 in the first direction and the position of the third partial region 13 in the first direction. The position of the fifth partial region 15 in the first direction is between the position of the third partial region 13 in the first direction and the position of the second partial region 12 in the first direction. The partial regions described above are continuous, for example.

The second semiconductor region 20 includes $Al_{x2}Ga_{1-x2}N$ ($0 < x2 < 1$, $x1 < x2$). The second semiconductor region 20 includes, for example, AlGaN. The Al composition ratio in the second semiconductor region 20 is not less than 0.15 and not more than 0.8.

The second semiconductor region 20 includes a first semiconductor portion 21 and a second semiconductor portion 22. The direction from the fourth partial region 14 to the first semiconductor portion 21 is along the second direction (for example, the Z-axis direction). The direction from the fifth partial region 15 to the second semiconductor portion 22 is along the second direction.

The first insulating member 41 includes a first insulating region 41a, a second insulating region 41b and a third insulating region 41c. The first insulating region 41a is between the fourth partial region 14 and at least a part of the third electrode 53 in the first direction (X-axis direction). The second insulating region 41b is between at least a part of the third electrode 53 and the fifth partial region 15 in the first direction (X-axis direction). The third insulating region 41c is between the third partial region 13 and the third electrode 53 in the second direction (Z-axis direction). These insulating regions may be continuous with each other.

The current flowing between the first electrode 51 and the second electrode 52 is controlled by the potential of the third electrode 53. The potential of the third electrode 53 is, for example, a potential based on the potential of the first electrode 51. One of the first electrode 51 and the second electrode 52 is, for example, a source electrode. The other of the first electrode 51 and the second electrode 52 is, for example, a drain electrode. The third electrode 53 is, for example, a gate electrode. At least a part of the first insulating member 41 is, for example, a gate insulating film. The semiconductor device 110 is, for example, a transistor. For example, the first semiconductor region 10 includes a portion facing the second semiconductor region 20. A carrier region (for example, a two-dimensional electron gas) is generated in this portion. The semiconductor device 110 is, for example, a HEMT (High Electron Mobility Transistor).

For example, the c-axis direction of the semiconductor member 10M is along the second direction (Z-axis direction). The angle between the c-axis direction and the Z-axis direction is 10 degrees or less. The carrier region is formed due to the difference in composition between the first semiconductor region 10 and the second semiconductor region 20.

The first electrode 51 is electrically connected to the first semiconductor portion 21, for example. The second electrode 52 is electrically connected to the second semiconductor portion 22, for example.

As shown in FIG. 1, the semiconductor member 10M includes a first face F1 and a first side face SF1. The third insulating region 41c is between the first face F1 and the third electrode 53 in the second direction (for example, the Z-axis direction). The first insulating region 41a is between the first side face SF1 and the third electrode 53 in the first direction (X-axis direction).

The first face F1 faces the bottom portion of the first insulating member 41 (or the third electrode 53). The first side face SF1 faces the side face of the first insulating member 41 (or the third electrode 53). As shown in FIG. 1, the semiconductor member 10M may include the second side face SF2. The second insulating region 41b is between the third electrode 53 and the second side face SF2 in the first direction (X-axis direction). The second side face SF2 faces another side face of the first insulating member 41 (or the third electrode 53).

As shown in FIG. 1, in the embodiment, at least a part of the first side face SF1 has an inverse taper. The angle of a part of the first side face SF1 is different from the angle of another part of the first side face SF1.

For example, the first side face SF1 includes a first side face portion Fp1 and a second side face portion Fp2. The position of the first side face portion Fp1 in the second direction (Z-axis direction) is between the position of the first face F1 in the second direction and the position of the second side face portion Fp2 in the second direction. An angle between the first face F1 and the first side face portion Fp1 is defined as a first angle $\theta p1$. The angle between the plane parallel to the first face F1 and the second side face portion Fp2 is defined as the second angle $\theta p2$. For example, the first angle $\theta p1$ corresponds to the angle between the first plane PL1 including the first face F1 and the first side face portion Fp1. The second angle $\theta p2$ corresponds to the angle between the first plane PL1 and the second side face portion Fp2. The first plane PL1 corresponds to, for example, the XY plane.

As shown in FIG. 1, in the embodiment, at least one of the first angle $\theta p1$ and the second angle $\theta p2$ is less than 90 degrees. For example, at least one of the first side face portion Fp1 and the second side face portion Fp2 has an inverse taper.

The second angle $\theta p2$ is different from the first angle $\theta p1$. In this example, the first angle $\theta p1$ is larger than the second angle $\theta p2$.

At least one of the first side face portion Fp1 and the second side face portion Fp2 has an inverse taper, so that, for example, a high threshold voltage can be obtained.

For example, the direction from the first semiconductor region 10 to the second semiconductor region 20 is along the +c-axis direction of the semiconductor member 10M. As a result, a carrier region is formed in a portion of the first semiconductor region 10 facing the second semiconductor region 20. For example, the carrier region is formed near the upper face of the fourth partial region 14. On the other hand, in the portion of the fourth partial region 14 opposing the third electrode 53, it is considered that polarization in the direction opposite to the +c-axis direction occurs. It is considered that this makes it difficult for current to flow in the portion of the fourth partial region 14 that opposes the third electrode 53.

As described above, in the embodiment, a high threshold voltage is obtained because at least a part of the first side face SF1 has an inverse taper.

In the embodiment, as described above, the second angle θp2 is different from the first angle θp1. As a result, the effective channel length can be shortened compared to the case where θp1 and θp2 are equal. The effective channel length corresponds to, for example, the length of the third insulating region 41c along the X-axis direction. For example, the length along the X-axis direction of the third insulating region 41c when the first angle θp1 is the same as the second angle θp2 is greater than the length along the X-axis direction of the third insulating region 41c when the first angle θp1 is larger than the second angle θp2. In the embodiment, the length of the third insulating region 41c along the X-axis direction can be shortened. Thereby, for example, low on-resistance can be obtained.

According to the embodiment, it is possible to provide a semiconductor device having improved characteristics. For example, a high threshold voltage can be obtained. For example, low on-resistance can be obtained.

In the embodiment, at least one of the first angle θp1 and the second angle θp2 is 85 degrees or less. Thereby, the threshold voltage can be stably increased.

In the embodiment, the absolute value of the difference between the first angle θp1 and the second angle θp2 is 2 degrees or more. The absolute value of the difference may be 5 degrees or more. The absolute value of the difference may be 10 degrees or more. The absolute value of the difference is, for example, 60 degrees or less. It becomes easy to control the threshold voltage and the on-resistance.

As shown in FIG. 1, the semiconductor member 10M may include a base body 10s and a buffer layer 18. The base body 10s includes at least one selected from the group consisting of silicon, silicon carbide, sapphire, gallium nitride, and aluminum nitride, for example. The buffer layer 18 is provided on the base body 10s. The buffer layer 18 includes, for example, a nitride semiconductor. The first semiconductor region 10 is provided on the buffer layer 18. The second semiconductor region 20 is provided on the first semiconductor region 10.

In this example, the semiconductor device 110 further includes a nitride member 30. The nitride member 30 includes, for example, $Al_{x3}Ga_{1-x3}N$ (0<x3<1). The nitride member 30 includes, for example, AlN or AlGaN. The composition ratio of Al in the nitride member 30 is, for example, 0.8 or more. For example, the composition x3 is higher than the composition ratio x1.

The nitride member 30 includes, for example, a first nitride region 31, a second nitride region 32, a third nitride region 33, a fourth nitride region 34, and a fifth nitride region 35. The first nitride region 31 is between the fourth partial region 14 and the first insulating region 41a in the first direction (X-axis direction). The second nitride region 32 is between the second insulating region 41b and the fifth partial region 15 in the first direction (X-axis direction). The third nitride region 33 is between the third partial region 13 and the third insulating region 41c in the second direction (Z-axis direction).

The first semiconductor portion 21 is between the fourth partial region 14 and the fourth nitride region 34 in the second direction (Z-axis direction). The second semiconductor portion 22 is between the fifth partial region 15 and the fifth nitride region 35 in the second direction.

For example, the crystallinity of the first nitride region 31 is higher than that of the fourth nitride region 34. For example, the crystallinity of the second nitride region 32 and the crystallinity of the third nitride region 33 are higher than the crystallinity of the fourth nitride region 34 and the crystallinity of the fifth nitride region 35. For example, the first nitride region 31, the second nitride region 32, and the third nitride region 33 include crystals (including polycrystal). For example, at least a part of the fourth nitride region 34 and the fifth nitride region 35 includes an amorphous region.

Since the first nitride region 31, the second nitride region 32, and the third nitride region 33 have high crystallinity, the semiconductor member 10M can maintain high crystallinity. For example, high mobility can be obtained.

The low crystallinity in at least a part of the fourth nitride region 34 and the fifth nitride region 35 provides high breakdown voltage, for example. Low leakage current can be obtained, for example. Stable characteristics can be obtained.

For example, the thickness of the third nitride region 33 along the second direction (Z-axis direction) is not less than 0.5 nm and not more than 5 nm. Such a thickness facilitates, for example, an improvement in electron mobility due to suppression of scattering effects, without a performance degradation caused by mechanical strain relaxation.

As shown in FIG. 1, the first insulating member 41 may include a fourth insulating region 41d and a fifth insulating region 41e. For example, the first semiconductor portion 21 is between the fourth partial region 14 and the fourth insulating region 41d in the Z-axis direction. For example, the second semiconductor portion 22 is between the fifth partial region 15 and the fifth insulating region 41e in the Z-axis direction. These semiconductor portions are covered, for example, by insulating regions. For example, stable characteristics can be obtained. For example, high reliability can be obtained.

The first insulating member 41 includes, for example, silicon and oxygen. The first insulating member 41 includes, for example, $SiO_2$. The first insulating member 41 may include $SiO_x$, for example. The first insulating member 41 may include SiON, for example.

For example, the fourth nitride region 34 is between the first semiconductor portion 21 and the fourth insulating region 41d. For example, the fifth nitride region 35 is between the second semiconductor portion 22 and the fifth insulating region 41e. For example, an AlN film and a silicon oxide film are laminated. It becomes easier to obtain more stable characteristics.

As shown in FIG. 1, the semiconductor device 110 may further include a second insulating member 42. The second insulating member 42 includes a first insulating portion 42p and a second insulating portion 42q. The first insulating portion 42p is between the first semiconductor portion 21 and the fourth nitride region 34. The second insulating portion 42q is between the second semiconductor portion 22 and the fifth nitride region 35.

For example, the second insulating member 42 includes nitrogen and the first insulating member 41 includes oxygen. For example, the second insulating member 42 includes silicon and nitrogen. For example, the first insulating member 41 includes silicon and oxygen. The first insulating member 41 does not include nitrogen. Alternatively, the concentration of nitrogen in the first insulating member 41 is lower than the concentration of nitrogen in the second insulating member 42. The second insulating member 42 includes SiN, for example. The second insulating member 42 may include SiN$_x$, for example. For example, a SiN film, an AlN film, and a silicon oxide film are stacked. It becomes easier to obtain more stable characteristics.

Figure 2:
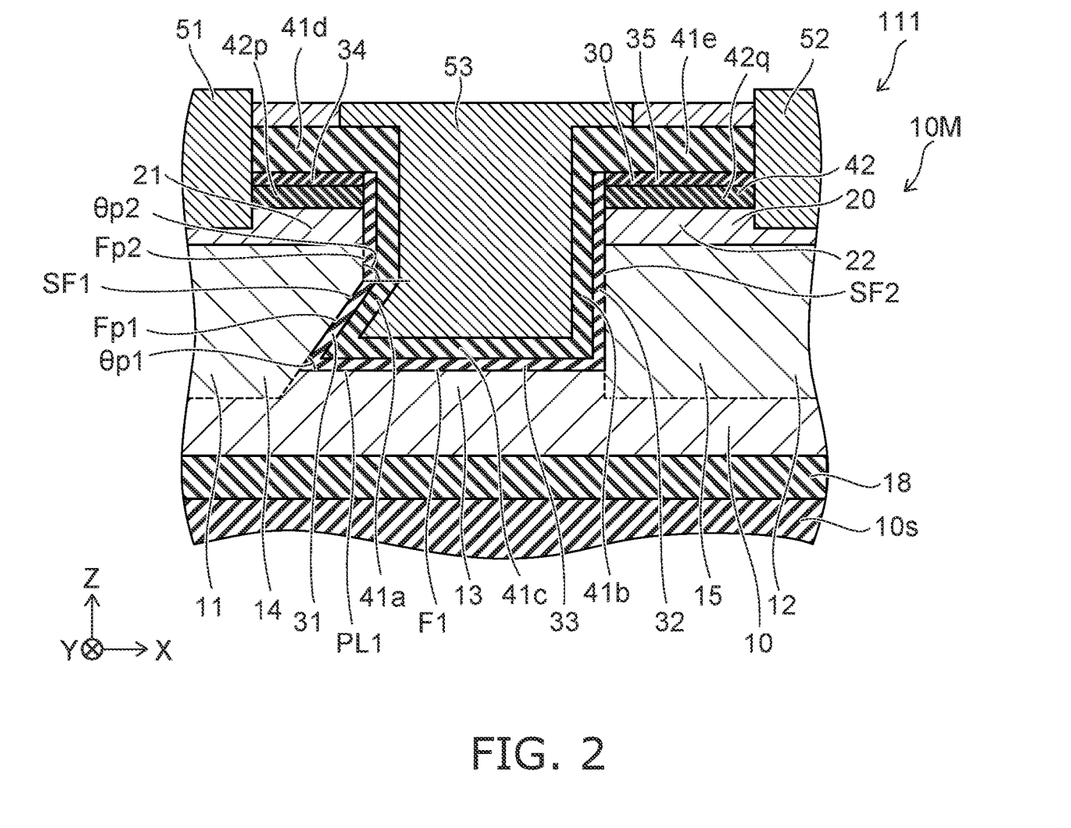
FIG. 2 is a schematic cross-sectional view illustrating the semiconductor device according to the first embodiment.

FIG. 2 is a schematic cross-sectional view illustrating the semiconductor device according to the first embodiment.

As shown in FIG. 2, in the semiconductor device 111 according to the embodiment, the first angle θp1 is smaller than the second angle θp2. In this example, the first angle θp1 is smaller than 90 degrees and the second angle θp2 is substantially 90 degrees. The other configurations of the semiconductor device 111 may be similar to those of the semiconductor device 110. Also in the semiconductor device 111, for example, a high threshold voltage is obtained. For example, low on-resistance can be obtained. A semiconductor device having improved characteristics can be provided.

Figure 3:
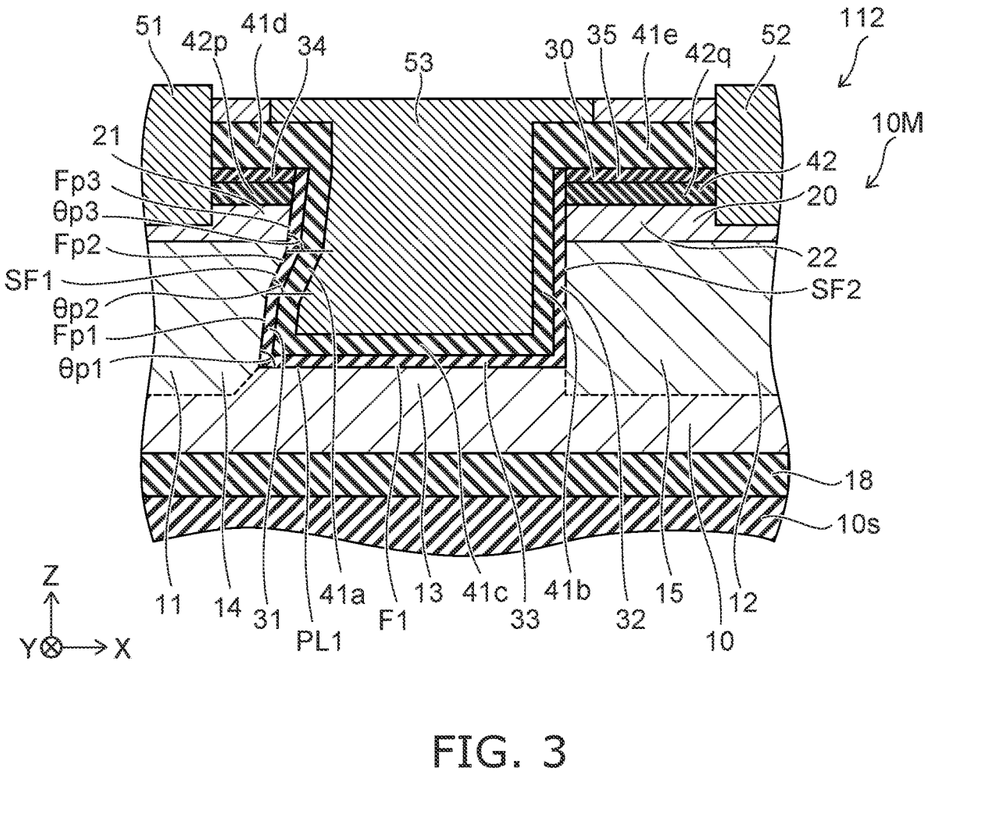
FIG. 3 is a schematic cross-sectional view illustrating the semiconductor device according to the first embodiment.

FIG. 3 is a schematic cross-sectional view illustrating the semiconductor device according to the first embodiment.

As shown in FIG. 3, in the semiconductor device 112 according to the embodiment, the first side face SF1 further includes a third side face portion Fp3 in addition to the first side face portion Fp1 and the second side face portion Fp2. The other configurations of the semiconductor device 112 may be similar to those of the semiconductor device 110.

As shown in FIG. 3, the position of the second side face portion Fp2 in the second direction (Z-axis direction) is between the position of the first side face portion Fp1 in the second direction and the position of the third side face portion Fp3 in the second direction. An angle between the first plane PL1 and the third side face portion Fp3 is defined as a third angle θp3. The third angle θp3 is different from the second angle θp2. For example, the first angle θp1 is larger than the second angle θp2. For example, the third angle θp3 is larger than the first angle θp1.

In one example, the second side face portion Fp2 is at least a part of the fourth partial region 14. The third side face portion Fp3 is at least a part of the first semiconductor portion 21.

Also in the semiconductor device 112, for example, a high threshold voltage can be obtained. For example, low on-resistance can be obtained. A semiconductor device having improved characteristics can be provided. The third angle θp3 may be substantially the same as the first angle θp1. Each of the first angle θp1 and the third angle θp3 may be larger than the second angle θp2.

Figure 4:
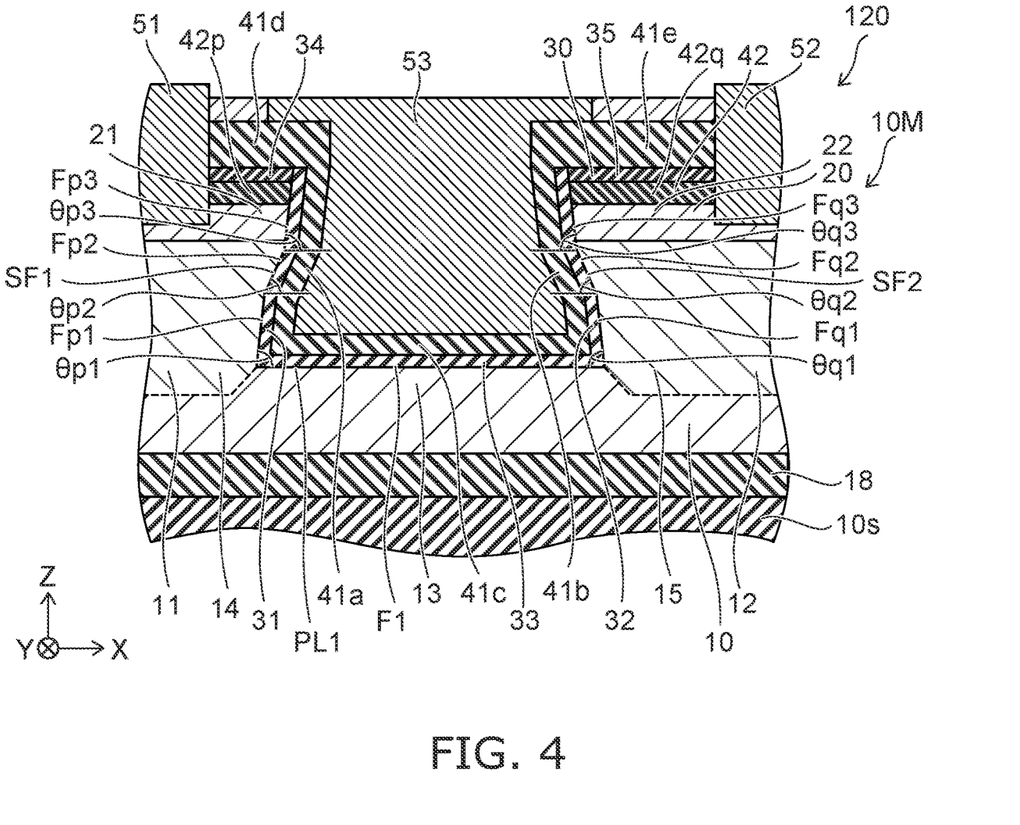
FIG. 4 is a schematic cross-sectional view illustrating the semiconductor device according to the first embodiment.

FIG. 4 is a schematic cross-sectional view illustrating the semiconductor device according to the first embodiment.

As shown in FIG. 4, in the semiconductor device 120 according to the embodiment, at least a part of the second side face SF2 is reverse tapered in addition to the first side face SF1. The other configurations of the semiconductor device 120 may be similar to those of the semiconductor device 110.

As shown in FIG. 4, the second insulating region 41b is located between the third electrode 53 and the second side face SF2 in the first direction (X-axis direction). The second side face SF2 includes a first facing side face portion Fq1 and a second facing side face portion Fq2.

The position of the first facing side face portion Fq1 in the second direction (Z-axis direction) is between the position of the first face F1 in the second direction and the position of the second facing side face portion Fq2 in the second direction. An angle between the first face F1 and the first facing side face portion Fq1 is defined as a first facing angle θq1. An angle between a plane parallel to the first face F1 and the second facing side face portion Fq2 is defined as a second facing angle θq2. The first facing angle θq1 corresponds to the angle between the first plane PL1 (for example, the XY plane) and the first facing side face portion Fq1. The second facing angle θq2 corresponds to the angle between the first plane PL1 (eg, XY plane) and the second facing side face portion Fq2. At least one of the first facing angle θq1 and the second facing angle θq2 is less than 90 degrees. For example, at least one of the first facing side face portion Fq1 and the second facing side face portion Fq2 has an inverse taper. For example, the second facing angle θq2 is different from the first facing angle θq1. In this example, the first facing angle θq1 is larger than the second facing angle θq2.

For example, the angle between the first plane PL1 (for example, the first face F1) and at least a part of the second side face SF2 is less than 90 degrees. With such a configuration, for example, a high threshold voltage can be obtained. For example, low on-resistance can be obtained. A semiconductor device having improved characteristics can be provided.

In this example, the second side face SF2 further includes a third facing side face portion Fq3. The position of the second facing side face portion Fq2 in the second direction (Z-axis direction) is between the position of the first facing side face portion Fq1 in the second direction and the position of the third facing side face portion Fq3 in the second direction. An angle between the first plane PL1 and the third facing side face portion Fq3 is defined as a third facing angle θq3. The third facing angle θq3 is different from the second facing angle θq2.

In this example, the first facing angle θq1 is larger than the second facing angle θq2. The third facing angle θq3 is larger than the first facing angle θq1.

In the semiconductor device 120, the first angle θp1, the second angle θp2, the third angle θp3, the first facing angle θq1, the second facing angle θq2, and the third facing angle θq3 are less than 90 degrees. The third angle θp3 may be substantially the same as the first angle θp1. Each of the first angle θp1 and the third angle θp3 may be larger than the second angle θp2. The third facing angle θq3 may be substantially the same as the first facing angle θq1. Each of the first facing angle θq1 and the third facing angle θq3 may be larger than the second angle θq2. The shape of the second side surface SF2 may be substantially symmetrical with respect to the shape of the first side surface SF1.

Figure 5:
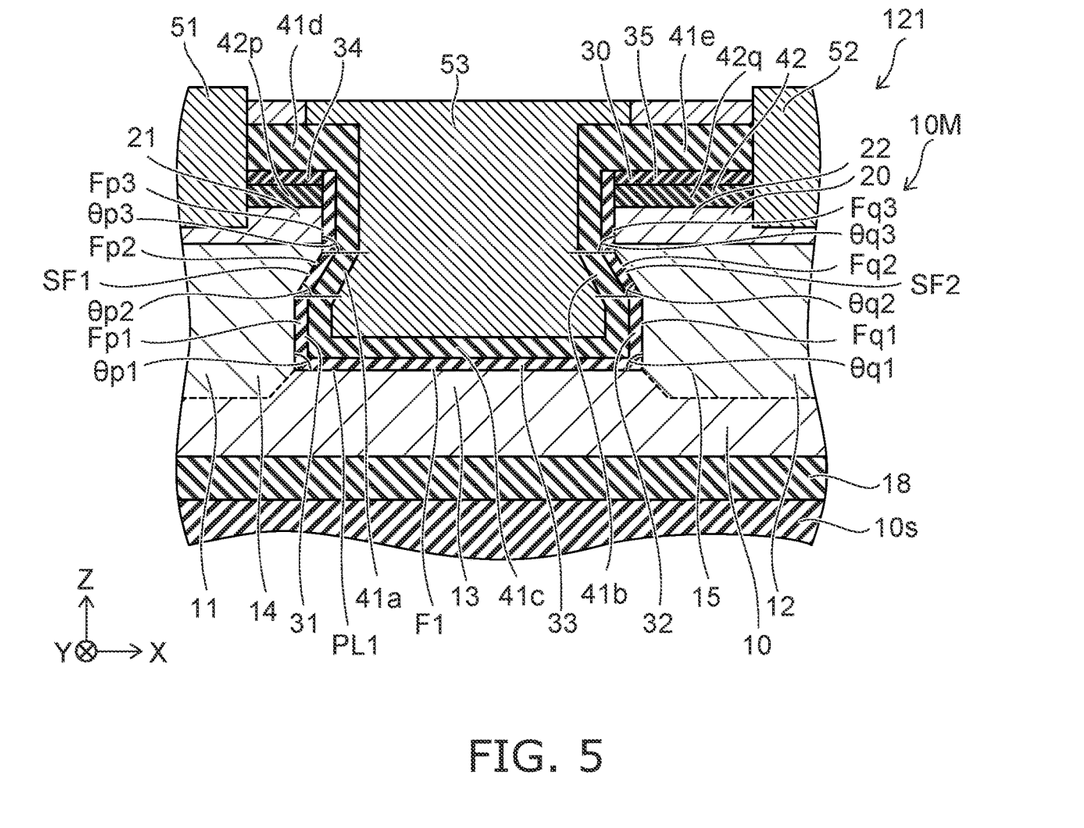
FIG. 5 is a schematic cross-sectional view illustrating the semiconductor device according to the first embodiment.

FIG. 5 is a schematic cross-sectional view illustrating the semiconductor device according to the first embodiment.

As shown in FIG. 5, the angle in the semiconductor device 121 according to the embodiment is different from the angle in the semiconductor device 120. The other configurations of the semiconductor device 121 may be similar to those of the semiconductor device 120.

In the semiconductor device 121, the first angle θp1, the third angle θp3, the first facing angle θq1, and the third facing angle θq3 are substantially 90 degrees. The second angle θp2 and the second facing angle θq2 are smaller than 90 degrees. Also in the semiconductor device 121, for example, a high threshold voltage is obtained. For example, low on-resistance can be obtained. A semiconductor device having improved characteristics can be provided.

Figure 6:
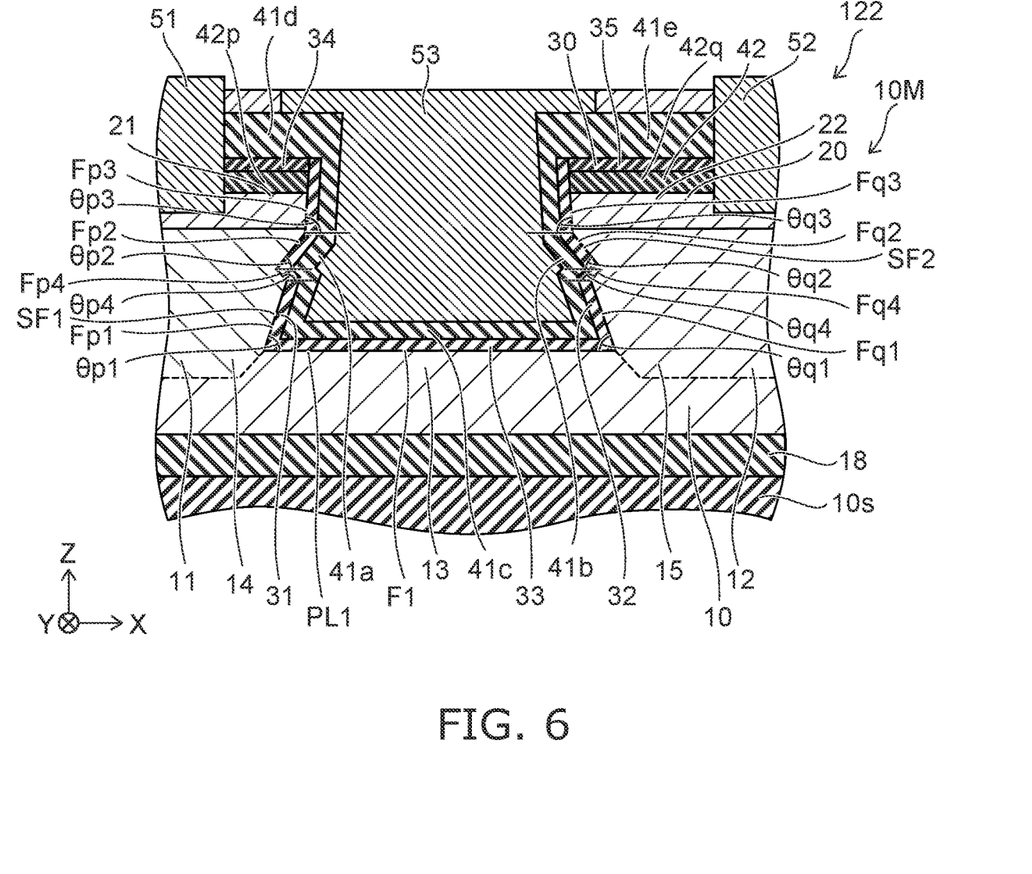
FIG. 6 is a schematic cross-sectional view illustrating the semiconductor device according to the first embodiment.

FIG. 6 is a schematic cross-sectional view illustrating the semiconductor device according to the first embodiment.

As shown in FIG. 6, in the semiconductor device 122 according to the embodiment, the first side face SF1 includes the fourth side face portion Fp4, and the second side face SF2 includes the fourth facing side face portion Fq4. The other configurations of the semiconductor device 122 may be similar to those of the semiconductor device 120.

The position of the fourth side face portion Fp4 in the second direction (Z-axis direction) is between the position of the first side face portion Fp1 in the second direction and the position of the second side face portion Fp2 in the second direction. An angle between the first plane PL1 and the fourth side face portion Fp4 is defined as a fourth angle θp4. The fourth angle θp4 is different from the first angle θp1 and is different from the second angle θp2.

In this example, the fourth angle θp4 is larger than 90 degrees. By providing such a fourth angle θp4, for example, it becomes easier to control the threshold voltage and the on-resistance. Thus, in the embodiment, the angle between the first plane PL1 and a part of the first side face SF1 may be larger than 90 degrees.

The position of the fourth facing side face portion Fq4 in the second direction (Z-axis direction) is between the position of the first facing side face portion Fq1 in the second direction and the position of the second facing side face portion Fq2 in the second direction. An angle between the first plane PL1 and the fourth facing side face portion Fq4 is defined as a fourth facing angle θq4. The fourth facing angle θq4 is different from the first facing angle θq1 and is different from the second facing angle θq2. For example, it becomes easier to control the threshold voltage and the on-resistance. Thus, in the embodiment, the angle between the first plane PL1 and a part of the second side face SF2 may be larger than 90 degrees.

In the semiconductor device 122, the angle of the side face portion may change. For example, the angle of a part of the third side face portion Fp3 and the angle of another part of the third side face portion Fp3 may be different from each other. For example, the angle of the facing side face portion may change. For example, the angle of a part of the third facing side face portion Fq3 and the angle of another part of the third facing side face portion Fq3 may be different from each other.

Figure 7:
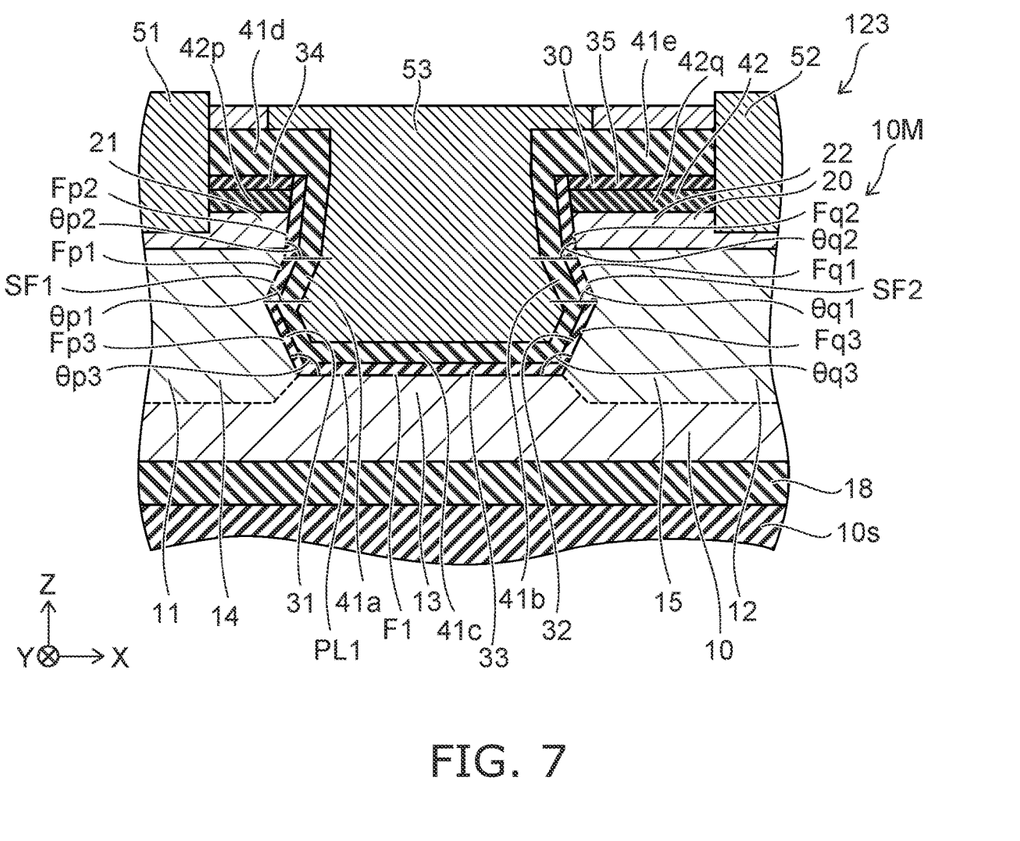
FIG. 7 is a schematic cross-sectional view illustrating the semiconductor device according to the first embodiment.

FIG. 7 is a schematic cross-sectional view illustrating the semiconductor device according to the first embodiment.

As shown in FIG. 7, in the semiconductor device 123 according to the embodiment, the first side surface portion Fp1 is between the third side surface portion Fp3 and the second side surface portion Fp2. The first facing side surface portion Fq1 is between the third facing side surface portion Fq3 and the second facing side surface portion Fq2. The first angle θp1, the second angle θp2, the first facing angle θq1 and the second facing angle θq2 are less than 90 degrees. In this example, the third angle θp3 and the third facing angle θq3 are larger than 90 degrees. In the semiconductor device 123, for example, a high threshold voltage can be obtained. For example, low on-resistance can be obtained. For example, a semiconductor device having improved characteristics can be provided.

Second Embodiment

The second embodiment relates to a method for manufacturing a semiconductor device.

FIGS. 8A to 8H and FIGS. 9A to 9D are schematic cross-sectional views illustrating the method for manufacturing the semiconductor device according to the second embodiment.

Figure 8A:
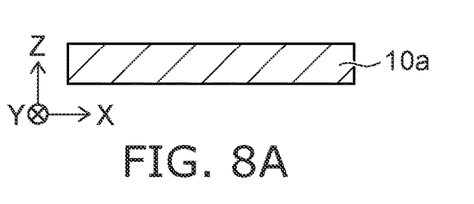
FIGS. 8A to 8H are schematic cross-sectional views illustrating the method for manufacturing a semiconductor device according to the second embodiment.

The semiconductor layer 10a is prepared as shown in FIG. 8A. At least a part of the semiconductor layer 10a becomes the first semiconductor region 10. The semiconductor layer 10a includes, for example, GaN.

Figure 8B:
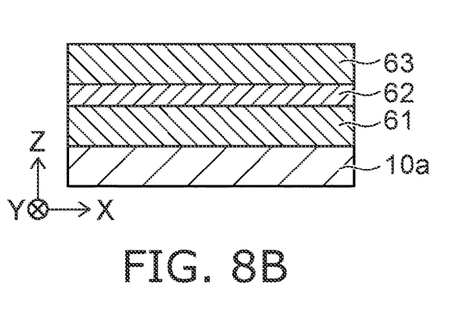

As shown in FIG. 8B, the first layer 61 is formed on the semiconductor layer 10a. The second layer 62 is formed on the first layer 61. The third layer 63 is formed on the second layer 62. The etching characteristics of these layers differ from each other. For example, the first layer 61 includes at least one selected from the group consisting of $SiO_x$, $SiN_x$, SiON, $AlO_x$, $Al_{1-x}Si_xO$, $HfO_x$, and $Al_{1-x}Hf_xO$. For example, the second layer 62 includes at least one selected from the group consisting of $SiO_x$, $SiN_x$, SiON, $AlO_x$, $Al_{1-x}Si_xO$, $HfO_x$, and, $Al_{1-x}Hf_xO$. For example, the third layer 63 includes at least one selected from the group consisting of $SiO_x$, $SiN_x$, SiON, $AlO_x$, $Al_{1-x}Si_xO$, $HfO_x$, and $Al_{1-x}Hf_xO$.

Figure 8C:
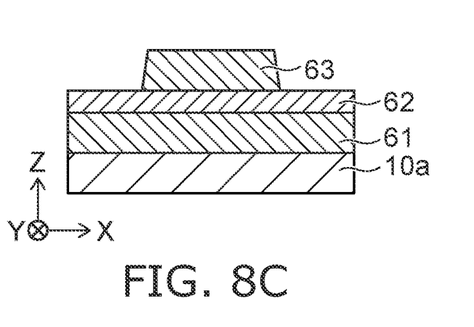

As shown in FIG. 8C, a part of the third layer 63 is removed. The side face of the third layer 63 has a forward tapered shape. In removing a part of the third layer 63, etching using a mask is performed.

Figure 8D:
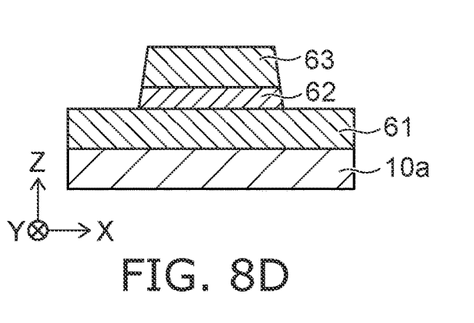

As shown in FIG. 8D, a part of the second layer 62 is removed using the remaining third layer 63 as a mask. In this process, another mask may be used in addition, for example photoresist or similar. The side face of the second layer 62 has a forward tapered shape.

Figure 8E:
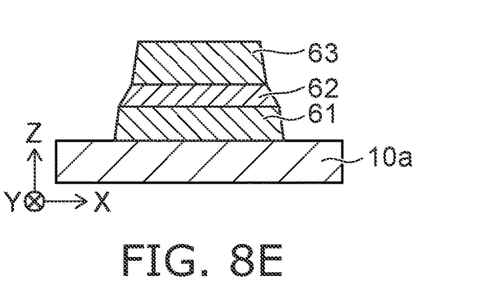

As shown in FIG. 8E, a part of the first layer 61 is removed using the remaining third layer 63 and the remaining second layer 62 as a mask. In this process, another mask may be used in addition, for example photoresist or similar. The side face of the first layer 61 has a forward tapered shape.

Figure 8F:
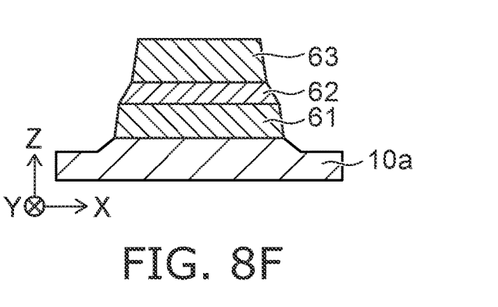

As shown in FIG. 8F, a part of the semiconductor layer 10a is removed using the remaining third layer 63, the remaining second layer 62, and the remaining first layer 61 as masks. In this process, another mask may be used in addition, for example photoresist or similar. Some side faces of the semiconductor layer 10a have a forward tapered shape. The taper angle of the side face of the third layer 63 is different from the taper angle of the side face of the second layer 62. The taper angle of the side face of the second layer 62 is different from the taper angle of the side face of the first layer 61.

Figure 8G:
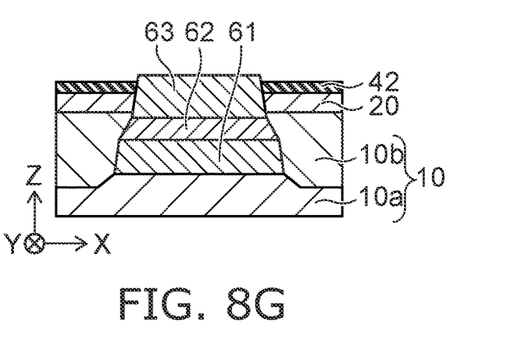

As shown in FIG. 8G, the semiconductor layer 10b is formed on the face of the semiconductor layer 10a. The semiconductor layer 10b is a regrown layer. The semiconductor layers 10a and 10b become the first semiconductor region 10. The second semiconductor region 20 is formed on the semiconductor layer 10b. The second insulating member 42 is formed on the second semiconductor region 20.

Figure 8H:
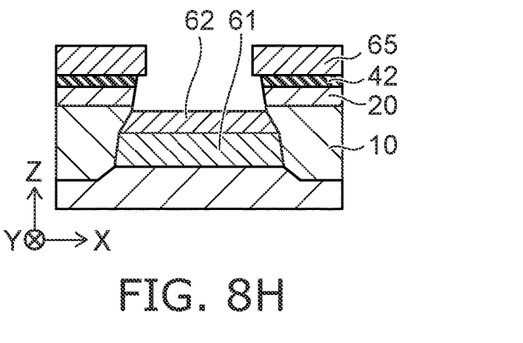

As shown in FIG. 8H, a mask 65 is formed on the second insulating member 42. The material of the mask 65 includes, for example, at least one selected from the group consisting of $SiO_x$, $SiN_x$, SiON, $AlO_x$, $Al_{1-x}Si_xO$, $HfO_x$, $Al_{1-x}Hf_xO$. The third layer 63 is removed using the mask 65 as a mask. The material of the mask 65 may include a photoresist, for example. Removal of the third layer 63, for example, may include etching using chemical solution. The chemical solution may include at least one selected form the group consisting of hydroflouric acid, hydrochloric acid, hydrobromic acid, sulphuric acid, nitric acid, phosphoric acid, acetic acid, formic acid, perchloric acid, tetramethylammonium hydroxide, ammonia, ammomium flouride, ammonia hydroxide, sodium hydroxide, potassium hydroxide, lithium hydroxide, magnesium hydroxide, calcium hydroxide, hydrogen peroxide, acetone, methanol and isopropanol. Removal of the third layer 63 may be performed by using plasma etch process. In the plasma etch process, gas including at least one selected from the group consisting of $Cl_x$, $BCl_3$, $CHF_x$, $C_xF_y$, and $SF_x$, can be used. In the removing the third layer 63, a process including the treatment using solutions and plasma etch process may be performed.

Figure 9A:
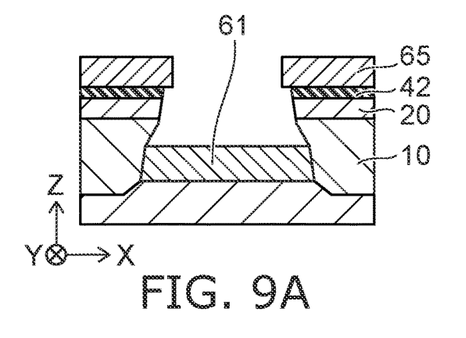
FIGS. 9A to 9D are schematic cross-sectional views illustrating the method for manufacturing a semiconductor device according to the second embodiment.

The second layer 62 is removed as shown in FIG. 9A. Removal of the second layer 62, for example, may include etching using chemical solution. The chemical solution may include at least one selected form the group consisting of hydroflouric acid, hydrochloric acid, hydrobromic acid, sulphuric acid, nitric acid, phosphoric acid, acetic acid, formic acid, perchloric acid, tetramethylammonium hydroxide, ammonia, ammomium flouride, ammonia hydroxide, sodium hydroxide, potassium hydroxide, lithium hydroxide, magnesium hydroxide, calcium hydroxide, hydrogen peroxide, acetone, methanol and isopropanol. Removal of the second layer 62 may be performed by using plasma etch process. In the plasma etch process, gas including at least one selected from the group consisting of $Cl_x$, $BCl_3$, $CHF_x$, $C_xF_y$, and $SF_x$, can be used. In the removing the second layer 62, a process including the treatment using solutions and plasma etch process may be performed.

Figure 9B:
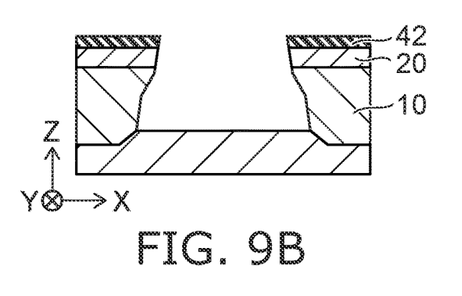

The first layer 61 is removed as shown in FIG. 9B. Removal of the first layer 61, for example, may include etching using chemical solution. The chemical solution may include at least one selected form the group consisting of hydroflouric acid, hydrochloric acid, hydrobromic acid, sulphuric acid, nitric acid, phosphoric acid, acetic acid, formic acid, perchloric acid, tetramethylammonium hydroxide, ammonia, ammomium flouride, ammonia hydroxide, sodium hydroxide, potassium hydroxide, lithium hydroxide, magnesium hydroxide, calcium hydroxide, hydrogen peroxide, acetone, methanol and isopropanol. Removal of the first layer 61 may be performed by using plasma etch process. In the plasma etch process, gas including at least one selected from the group consisting of $Cl_x$, $BCl_3$, $CHF_x$, $C_xF_y$, and $SF_x$, can be used. In the removing the first layer 61, a process including the treatment using solutions and plasma etch process may be performed.

The mask 65 may be removed, for example, by processes such as those mentioned above. For example, the mask 65 may be removed using the same process as used to remove the first layer 61.

Figure 9C:
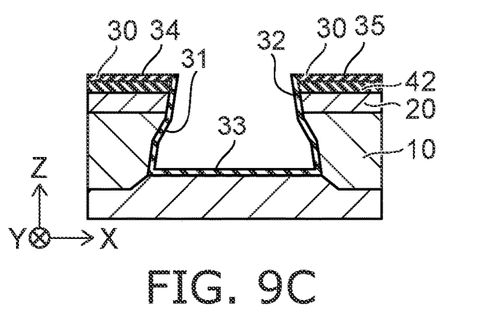

As shown in FIG. 9C, the nitride member 30 is formed.

Figure 9D:
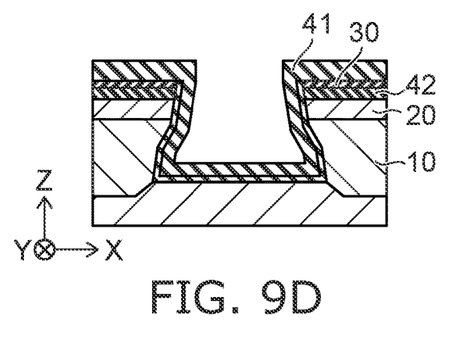

As shown in FIG. 9D, the first insulating member 41 is formed. After that, the third electrode 53 is formed. The first insulating member 41, the nitride member 30 and the second insulating member 42 are partially removed to form the first electrode 51 and the second electrode 52. Thereby, for example, the semiconductor device 120 can be formed.

According to the manufacturing method of the embodiment, it is possible to manufacture a semiconductor device having improved characteristics.

According to the embodiment, it is possible to provide a semiconductor device having improved characteristics.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, "nitride semiconductor" includes all compositions of semiconductors of the chemical formula $B_xIn_yAl_zGa_{1-x-y-z}N$ ($0\leq x\leq 1$, $0\leq y\leq 1$, $0\leq z\leq 1$, and $x+y+z\leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor layers, electrodes, insulating portions, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first electrode;
a second electrode;
a third electrode, a position of the third electrode in a first direction being between a position of the first electrode in the first direction and a position of the second electrode in the first direction, the first direction being from the first electrode to the second electrode;
a semiconductor member including a first semiconductor region and a second semiconductor region,
the first semiconductor region including $Al_{x1}Ga_{1-x1}N$ ($0\leq x1<1$), the first semiconductor region including a first partial region, a second partial region, a third partial region, a fourth partial region, and a fifth partial region, a direction from the second partial region to the second electrode being along a second direction, the second direction crossing the first direction, a direction from the third partial region to the third electrode being along the second direction, a position of the fourth partial region in the first direction being between the position of the first partial region in the first direction and the position of the third partial region in the first direction, a position of the fifth partial region in the first direction being between the position of the third partial region in the first direction and the position of the second partial region in the first direction,
the second semiconductor region including $Al_{x2}Ga_{1-x2}N$ ($0<x2<1$, $x1<x2$), the second semiconductor region including a first semiconductor portion and a second semiconductor portion, a direction from the fourth partial region to the first semiconductor portion being along the second direction, a direction from the fifth partial region to the second semiconductor portion being along the second direction; and a first insulating member including a first insulating region, a second insulating region, and a third insulating region, the first insulating region being between the fourth partial region and at least a part of the third electrode in the first direction, the second insulating region being between at least a part of the third electrode and the fifth partial region in the first direction, the third insulating region being between the third partial region and the third electrode in the second direction, the semiconductor member including a first face and a first side face, the third insulating region being between the first face and the third electrode in the second direction, the first insulating region being between the first side face and the third electrode in the first direction, the first side face including a first side face portion and a second side face portion, a position of the first side face portion in the second direction being between a position of the first face in the second direction and a position of the second side face portion in the second direction, at least a first internal angle measured towards the third electrode and a second internal angle measured towards the third electrode, both being less than 90 degrees, the first angle being an angle between a first plane directly aligned along with the first face and the first side face portion, the second angle being an angle between a second plane parallel to the first plane and the second side face portion, and the second internal angle being different from the first internal angle.

2. The semiconductor device according to claim 1, wherein the first internal angle is larger than the second internal angle.

3. The semiconductor device according to claim 1, wherein an absolute value of a difference between the first internal angle and the second internal angle is 2 degrees or more.

4. The semiconductor device according to claim 1, wherein at least one of the first internal angle and the second internal angle is 85 degrees or less.

5. The semiconductor device according to claim 1, wherein
the first side face further includes a third side face portion,
the position of the second side face portion in the second direction is between the position of the first side face portion in the second direction and a position of the third side face portion in the second direction, and
a third internal angle between a third plane parallel to the first plane and the third side face portion is different from the second internal angle.

6. The semiconductor device according to claim 5, wherein the third internal angle is less than 90 degrees.

7. The semiconductor device according to claim 5, wherein
the first internal angle is larger than the second internal angle, and
the third internal angle is larger than the first internal angle.

8. The semiconductor device according to claim 5, wherein
the second side face portion is at least a part of the fourth partial region, and
the third side face portion is at least a part of the first semiconductor portion.

9. The semiconductor device according to claim 8, wherein the fourth internal angle is larger than 90 degrees.

10. The semiconductor device according to claim 1, wherein
the first side face further includes a fourth side face portion,
a position of the fourth side face portion in the second direction is between the position of the first side face portion in the second direction and the position of the second side face portion in the second direction, and
a fourth internal angle between a fourth plane parallel to the first plane and the fourth side face portion is different from the first internal angle and different from the second internal angle.

11. The semiconductor device according to claim 1, wherein an angle between the first plane and a part of the first side face is larger than 90 degrees.

12. The semiconductor device according to claim 1, wherein
the semiconductor member further includes a second side face,
the second insulating region is between the third electrode and the second side face in the first direction,
the second side face includes a first facing side face portion and a second facing side face portion,
a position of the first facing side face portion in the second direction is between the position of the first face in the second direction and a position of the second facing side face portion in the second direction,
at least one of a first facing internal angle between the first plane and the first facing side face portion and a second facing internal angle between the second plane and the second facing side face portion is less than 90 degrees, and
the second facing internal angle is different from the first facing internal angle.

13. The semiconductor device according to claim 12, wherein
the second side face further includes a third facing side face portion,
the position of the second facing side face portion in the second direction is between the position of the first facing side face portion in the second direction and a position of the third facing side face portion in the second direction, and
a third facing internal angle between the third plane and the third facing side face portion is different from the second facing internal angle.

14. The semiconductor device according to claim 13, wherein
the first facing internal angle is larger than the second facing internal angle, and
the third facing internal angle is larger than the first facing internal angle.

15. The semiconductor device according to claim 12, wherein,
the second side face further includes a fourth facing side face portion,
a position of the fourth facing side face portion in the second direction is between the position of the first facing side face portion in the second direction and the position of the second facing side face portion in the second direction, and
a fourth facing internal angle between the fourth plane and the fourth facing side face portion is different from the first facing internal angle and different from the second facing internal angle.

16. The semiconductor device according to claim 12, wherein an angle between the first plane and a part of the second side face is larger than 90 degrees.

17. The semiconductor device according to claim 1, further comprising: a nitride member including $Al_{x3}Ga_{1-x3}N$ (0<x3<1),
- the nitride member including a first nitride region, a second nitride region, a third nitride region, a fourth nitride region and a fifth nitride region,
- the first nitride region being between the fourth partial region and the first insulating region in the first direction,
- the second nitride region being between the second insulating region and the fifth partial region in the first direction,
- the third nitride region being between the third partial region and the third insulating region in the second direction,
- the first semiconductor portion being between the fourth partial region and the fourth nitride region in the second direction,
- the second semiconductor portion being between the fifth partial region and the fifth nitride region in the second direction,
- the crystallinity of the first nitride region being higher that at of the fourth nitride region.

18. The semiconductor device according to claim 17, further comprising:
- a second insulating member,
- the second insulating member including a first insulating portion and a second insulating portion,
- the first insulating portion being between the first semiconductor portion and the t with nitride region,
- the second insulating portion being between the second semiconductor portion and the fifth nitride region,
- the second insulating member including nitrogen, the first insulating member including oxygen,
- the first insulating member not including nitrogen, or a concentration of nitrogen in the first insulating member being lower than a concentration of nitrogen in the second insulating member.

19. The semiconductor device according to claim 17, wherein a thickness of the third nitride region along the second direction is not less than 0.5 nm and not more than 5 nm.

20. The semiconductor device according to claim 1, wherein a c-axis direction of the semiconductor member is along the second direction.

* * * * *